US012796279B2

(12) United States Patent
Ha et al.

(10) Patent No.: US 12,796,279 B2
(45) Date of Patent: Nov. 10, 2026

(54) DISPLAY DEVICE WITH TOUCH LINES AND CONNECTION ELECTRODE

(71) Applicant: LG Display Co., Ltd., Seoul (KR)

(72) Inventors: Jongmoo Ha, Gimpo-si (KR); Kyuwon Kyoung, Seoul (KR)

(73) Assignee: LG DISPLAY CO., LTD., Seoul (KR)

( * ) Notice: Subject to any disclaimer, the term of this patent is extended or adjusted under 35 U.S.C. 154(b) by 326 days.

(21) Appl. No.: 18/511,587

(22) Filed: Nov. 16, 2023

(65) Prior Publication Data

US 2024/0172520 A1 May 23, 2024

(30) Foreign Application Priority Data

Nov. 17, 2022 (KR) ........................ 10-2022-0154446

(51) Int. Cl.

| | |
|---|---|
| ***H10K 59/40*** | (2023.01) |
| ***G06F 3/041*** | (2006.01) |
| ***G06F 3/044*** | (2006.01) |
| ***H10K 59/131*** | (2023.01) |

(52) U.S. Cl.

CPC ........... *H10K 59/40* (2023.02); *G06F 3/0412* (2013.01); *H10K 59/131* (2023.02); *G06F 3/0446* (2019.05)

(58) Field of Classification Search

CPC ..... H10K 59/40; G06F 3/0412; G09G 3/3266

See application file for complete search history.

(56) References Cited

U.S. PATENT DOCUMENTS

| | | | | |
|---|---|---|---|---|
| 2019/0131572 | A1* | 5/2019 | Gwon | G06F 3/0412 |
| 2019/0237533 | A1* | 8/2019 | Kim | G06F 3/0412 |
| 2020/0091252 | A1 | 3/2020 | Bang et al. | |
| 2020/0118518 | A1* | 4/2020 | Chu | G09G 3/2096 |
| 2020/0342806 | A1 | 10/2020 | Kim et al. | |
| 2021/0083013 | A1* | 3/2021 | Bang | G06F 3/0412 |
| 2021/0408211 | A1* | 12/2021 | Lim | G02F 1/1345 |
| 2023/0006174 | A1* | 1/2023 | Park | G06F 3/0412 |
| 2024/0094838 | A1* | 3/2024 | Cho | G06F 3/0412 |

FOREIGN PATENT DOCUMENTS

| | | | |
|---|---|---|---|
| KR | 10-2020-0032291 | A | 3/2020 |
| KR | 10-2020-0126473 | A | 11/2020 |
| KR | 10-2021-0032608 | A | 3/2021 |
| KR | 10-2021-0042202 | A | 4/2021 |

* cited by examiner

*Primary Examiner* — Chad M Dicke

*Assistant Examiner* — Jeremy Daniel Watts

(74) *Attorney, Agent, or Firm* — Birch, Stewart, Kolasch & Birch, LLP

(57) ABSTRACT

A display device can include a light emitting element disposed in an active area of a substrate, the light emitting element including a first electrode, a light emitting layer, and a second electrode, and a connection electrode disposed in a non-active area of the substrate, the connection electrode being electrically connected to the first electrode of the light emitting element. Also, a plurality of touch routing lines are disposed in the non-active area; and a plurality of signal lines disposed in the non-active area. The connection electrode is disposed between the plurality of signal lines and the plurality of touch routing lines, and at least one of the plurality of touch routing lines includes a hole overlapping with a hole in the connection electrode.

31 Claims, 9 Drawing Sheets

DISPLAY DEVICE WITH TOUCH LINES AND CONNECTION ELECTRODE

CROSS-REFERENCE TO RELATED APPLICATIONS

This application claims priority to Korean Patent Application No. 10-2022-0154446 filed on Nov. 17, 2022, in the Republic of Korea, the entire contents of which are hereby expressly incorporated by reference into the present application.

BACKGROUND

Technical Field

The present disclosure relates to a display device, and more particularly, to a display device allowing for a reduction in noise generation.

Discussion of the Related Art

Recently, as society advances toward an information-oriented society, the field of display devices for visually expressing an electrical information signal has rapidly advanced. Various display devices having excellent performance in terms of thinness, lightness, and low power consumption, are being developed correspondingly. Specific examples of such display devices can include a liquid crystal display (LCD), a plasma display panel device (PDP), a field emission display device (FED), an organic light emitting display (OLED), and the like.

The display device can include an input device so that a user can input information by touching a display screen with a finger or a pen while viewing the display screen. For example, a touch sensor for sensing a touch input can be attached to one surface of the display device or integrally formed with the display device. In addition, the development of display devices is being continued by adding cameras, speakers, and sensors. However, as display devices are made smaller or more compact, various wiring lines can overlap with touch routing lines, which can cause interference and generate noise that impairs image quality and reduces touch sensing accuracy.

SUMMARY OF THE DISCLOSURE

An aspect of the present disclosure is to provide a display device capable of reducing coupling between upper and lower signal lines that overlap with each other.

Another aspect of the present disclosure is to provide a display device allowing for a reduction in defects of the display device caused by noise generation.

Objects of the present disclosure are not limited to the above-mentioned objects, and other objects, which are not mentioned above, can be clearly understood by those skilled in the art from the following descriptions.

A display device according to an embodiment of the present disclosure includes a substrate including an active area and a non-active area surrounding the active area; a light emitting element in the active area and including an anode, an organic layer, and a cathode; a connection electrode in the non-active area and disposed on the same layer as the anode; an encapsulation unit covering the light emitting element and the connection electrode; a plurality of touch electrodes on the encapsulation unit in the active area; and a plurality of touch routing lines in the non-active area and connected to the plurality of touch electrodes, in which the connection electrode includes a contact portion connected to the cathode in a contact area, and the contact portion extends longer toward an outer portion of the non-active area from the contact area.

A display device according to another embodiment of the present disclosure includes a substrate including an active area and a non-active area surrounding the active area; a light emitting element in the active area and including an anode, an organic layer, and a cathode; a connection electrode in the non-active area and disposed on the same layer as the anode; an encapsulation unit covering the light emitting element and the connection electrode; a plurality of touch electrodes on the encapsulation unit in the active area; and a plurality of touch routing lines in the non-active area and connected to the plurality of touch electrodes, in which the connection electrode includes a plurality of first holes, and at least one touch routing line overlapping with the connection electrode among the plurality of touch routing lines includes a plurality of second holes corresponding to the plurality of first holes.

A display device according to another embodiment of the present disclosure includes a light emitting element disposed in an active area of a substrate, the light emitting element including a first electrode, a light emitting layer, and a second electrode; a connection electrode disposed in a non-active area of the substrate, the connection electrode being electrically connected to the first electrode of the light emitting element; a plurality of touch routing lines disposed in the non-active area; and a plurality of signal lines disposed in the non-active area, in which the connection electrode is disposed between the plurality of signal lines and the plurality of touch routing lines, and at least one of the plurality of touch routing lines includes a hole overlapping with a hole in the connection electrode.

A display device according to an embodiment of the present disclosure includes a light emitting element disposed in an active area of a substrate, the light emitting element including a first electrode, a light emitting layer, and a second electrode; a connection electrode disposed in a non-active area of the substrate, the connection electrode being electrically connected to the first electrode of the light emitting element; a plurality of touch routing lines disposed in the non-active area; and a plurality of signal lines disposed in the non-active area, in which a contact area of the connection electrode directly contacts the second electrode of the light emitting element, a first portion of the connection electrode extends away from the contact area in a direction toward the non-active area, and a second portion of the connection electrode extends away from the contact area in a direction toward the active area, and a first length of the first portion of the connection electrode is greater than a second length of the second portion of the connection electrode.

A display device according to another embodiment of the present disclosure includes a light emitting element disposed in an active area of a substrate, the light emitting element including a first electrode, a light emitting layer, and a second electrode; a connection electrode disposed in a non-active area of the substrate, the connection electrode being electrically connected to the first electrode of the light emitting element; a plurality of touch routing lines disposed in the non-active area; and a plurality of signal lines disposed in the non-active area, in which a portion of the connection electrode overlaps with the second electrode.

Other detailed matters of the example embodiments are included in the detailed description and the drawings.

According to the present disclosure, generation of noise between a touch routing line and a signal line can be prevented.

According to the present disclosure, coupling of electrical signals of a touch routing line and a signal line can be prevented.

The effects according to the present disclosure are not limited to the contents discussed above, and more various effects are included in the present specification.

BRIEF DESCRIPTION OF THE DRAWINGS

The above and other objects, features, and advantages of the present disclosure will become more apparent to those of ordinary skill in the art by describing example embodiments thereof in detail with reference to the attached drawings, which are briefly described below.

DETAILED DESCRIPTION OF THE EMBODIMENTS

Figure 1:
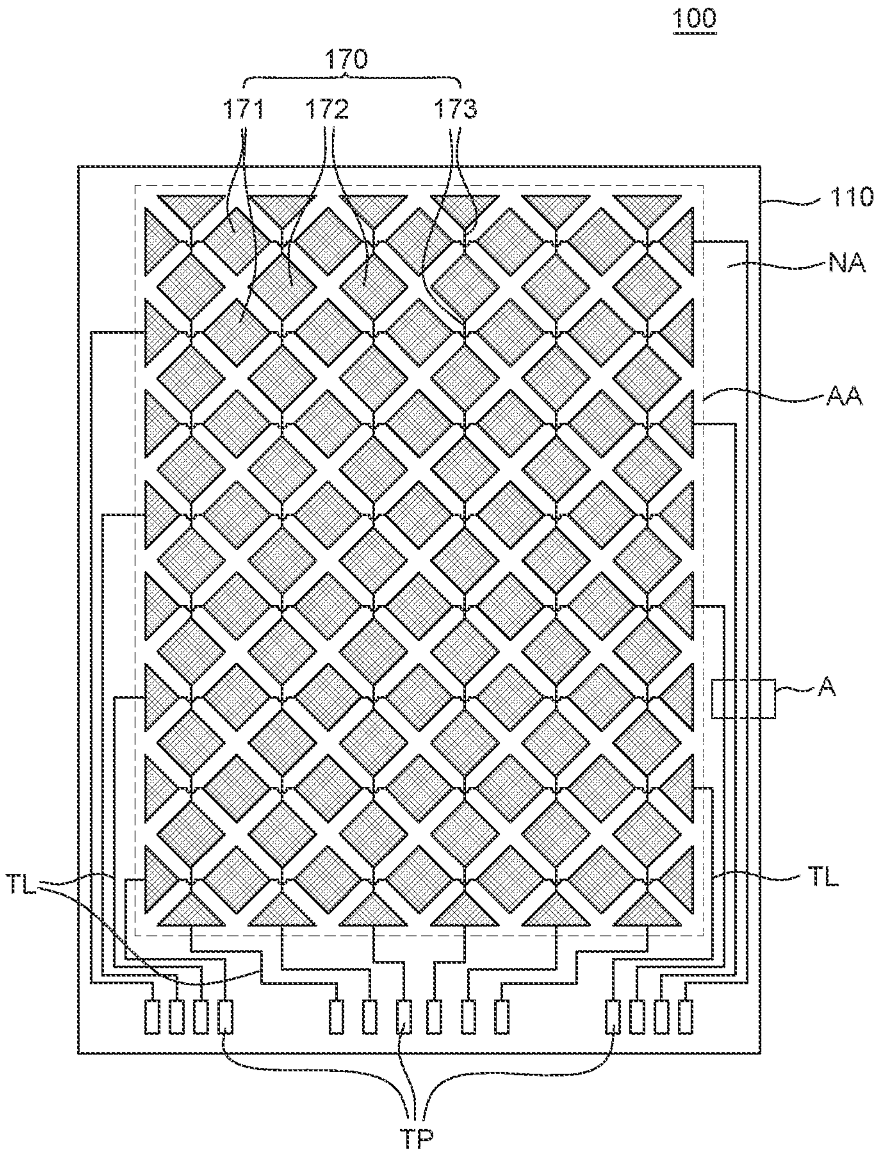
FIG. 1 is a schematic plan view of a display device according to an example embodiment of the present disclosure.

Advantages and characteristics of the present disclosure and a method of achieving the advantages and characteristics will be clear by referring to example embodiments described below in detail together with the accompanying drawings. However, the present disclosure is not limited to the example embodiments disclosed herein but will be implemented in various forms. The example embodiments are provided by way of example only so that those skilled in the art can fully understand the disclosures of the present disclosure and the scope of the present disclosure.

The shapes, sizes, ratios, angles, numbers, and the like illustrated in the accompanying drawings for describing the example embodiments of the present disclosure are merely examples, and the present disclosure is not limited thereto. Like reference numerals generally denote like elements throughout the specification. Further, in the following description of the present disclosure, a detailed explanation of known related technologies can be omitted to avoid unnecessarily obscuring the subject matter of the present disclosure. The terms such as "including," "having," and "consist of" used herein are generally intended to allow other components to be added unless the terms are used with the term "only." Any references to singular can include plural unless expressly stated otherwise.

Components are interpreted to include an ordinary error range even if not expressly stated.

When the position relation between two parts is described using the terms such as "on," "above," "below," and "next," one or more parts can be positioned between the two parts unless the terms are used with the term "immediately" or "directly."

When an element or layer is disposed "on" another element or layer, another layer or another element can be interposed directly on the other element or therebetween.

Although the terms "first," "second," and the like are used for describing various components, these components are not confined by these terms. These terms are merely used for distinguishing one component from the other components. Therefore, a first component to be mentioned below can be a second component in a technical concept of the present disclosure.

Like reference numerals generally denote like elements throughout the specification.

A size and a thickness of each component illustrated in the drawing are illustrated for convenience of description, and the present disclosure is not limited to the size and the thickness of the component illustrated.

The features of various embodiments of the present disclosure can be partially or entirely adhered to or combined with each other and can be interlocked and operated in technically various ways, and the embodiments can be carried out independently of or in association with each other.

Hereinafter, the present disclosure will be described in detail with reference to accompanying drawings.

FIG. 1 is a schematic plan view of a display device according to an example embodiment of the present disclosure. In FIG. 1, only a substrate 110, a plurality of touch electrodes 170, a plurality of touch routing lines TL, and a plurality of touch pads TP among components of a display device 100 are briefly illustrated for convenience of explanation.

The substrate 110 is a support member for supporting other components of the display device 100. The substrate 110 includes an active area AA and a non-active area NA. The substrate 110 can be formed of an insulating material. For example, the substrate 110 can be formed of glass or resin. In addition, the substrate 110 can be formed of a polymer or plastic such as polyimide (PI), or can be formed of a material having flexibility.

The active area AA is an area for displaying an image. A plurality of sub-pixels for displaying an image and a driving circuit for driving the plurality of sub-pixels can be disposed in the active area AA. Each of the plurality of sub-pixels is an individual unit that emits light, and a light emitting element 140 to be described below can be disposed in each of the plurality of sub-pixels. The plurality of sub-pixels can include a red sub-pixel, a green sub-pixel, a blue sub-pixel, and a white sub-pixel, but are not limited thereto. The driving circuit can include various transistors, storage capacitors, lines, and the like for driving the plurality of sub-pixels. For example, the driving circuit can include various components such as a driving transistor, a switching transistor, a sensing transistor, a storage capacitor, gate lines, and data lines, but the present disclosure is not limited thereto.

The plurality of touch electrodes 170 are disposed in the active area AA. The plurality of touch electrodes 170 can include a plurality of first touch electrodes 171 and a plurality of second touch electrodes 172. The plurality of first touch electrodes 171 and the plurality of second touch electrodes 172 can be disposed such that portions thereof cross each other. For example, the plurality of first touch electrodes 171 and the plurality of second touch electrodes 172 can be disposed such that portions thereof overlap each other.

The plurality of touch electrodes 170 can sense a touch input applied to the display device 100. In this situation, the touch input can be an input by a user's finger or a touch pen. Specifically, when a touch operation is performed on a specific area of the display device 100, a change in capacitance can occur between the first touch electrodes 171 and the second touch electrodes 172 adjacent to the specific area. The display device 100 can detect touch coordinates by detecting the change in capacitance.

Each of the plurality of first touch electrodes 171 extends in a first direction. The plurality of first touch electrodes 171 can be spaced apart by a predetermined distance in a second direction. Here, the first direction can be a horizontal direction based on FIG. 1, and the second direction can be a vertical direction based on FIG. 1. The plurality of first touch electrodes 171 can be continuously formed without being disconnected in the first direction. Further, the plurality of first touch electrodes 171 disposed in the second direction can be electrically insulated from each other.

The plurality of second touch electrodes 172 extend in the second direction. The plurality of second touch electrodes 172 disposed in the second direction can be separated in a specific area. Specifically, the plurality of second touch electrodes 172 can be formed to be separated in areas where they overlap the first touch electrodes 171 and the second touch electrodes 172. The separated second touch electrodes 172 can be connected by bridge electrodes 173. For example, the second touch electrodes 172 disposed in the second direction can be electrically connected by the bridge electrodes 173. The plurality of second touch electrodes 172 can be spaced apart by a predetermined distance in the first direction. The plurality of second touch electrodes 172 disposed in the first direction can be electrically insulated from each other.

The plurality of first touch electrodes 171 and the plurality of second touch electrodes 172 can be spaced apart from each other by a predetermined distance. Accordingly, the plurality of first touch electrodes 171 and the plurality of second touch electrodes 172 can be electrically separated from each other. The plurality of first touch electrodes 171 and the plurality of second touch electrodes 172 can have a metal mesh structure. Specifically, the plurality of first touch electrodes 171 and the plurality of second touch electrodes 172 can include a mesh pattern formed by crossing metal lines having a very thin line width. The mesh pattern can have a diamond shape, but is not limited thereto. The mesh pattern can have a single layer or multilayer structure formed of a metal material, such as molybdenum (Mo), silver (Ag), titanium (Ti), copper (Cu), aluminum (Ti), titanium/aluminum/titanium (Ti/Al/Ti), or molybdenum/aluminum/molybdenum (Mo/Al/Mo), but is not limited thereto.

An opening OP, which will be described later, can be formed in the mesh pattern of the plurality of first touch electrodes 171 and the plurality of second touch electrodes 172. The opening OP can correspond to the sub-pixel. For example, the light emitting element 140 can be disposed in the opening OP.

The non-active area NA is an area in which an image is not displayed, and is disposed to surround the active area AA. The non-active area NA is an area where various lines, pads, driver ICs, and the like are disposed for driving the sub-pixels and the plurality of touch electrodes 170 disposed in the active area AA. For example, various driver ICs such as a gate driver and a data driver can be disposed in the non-active area NA.

The plurality of touch routing lines TL are disposed in the non-active area NA. The plurality of touch routing lines TL can be electrically connected to the plurality of first touch electrodes 171 and the plurality of second touch electrodes 172. For example, one ends of the plurality of touch routing lines TL can be connected to the plurality of first touch electrodes 171 or the plurality of second touch electrodes 172, and the other ends of the plurality of touch routing lines TL can be connected to the plurality of touch pads TP.

The plurality of touch pads TP are disposed in the non-active area NA. The plurality of touch pads TP can be electrically connected to the ends of the plurality of touch routing lines TL. Further, external circuits can be connected to the plurality of touch pads TP. Accordingly, the plurality of touch pads TP can receive a touch signal from the outside or transmit a touch detection signal to the outside.

Figure 2:
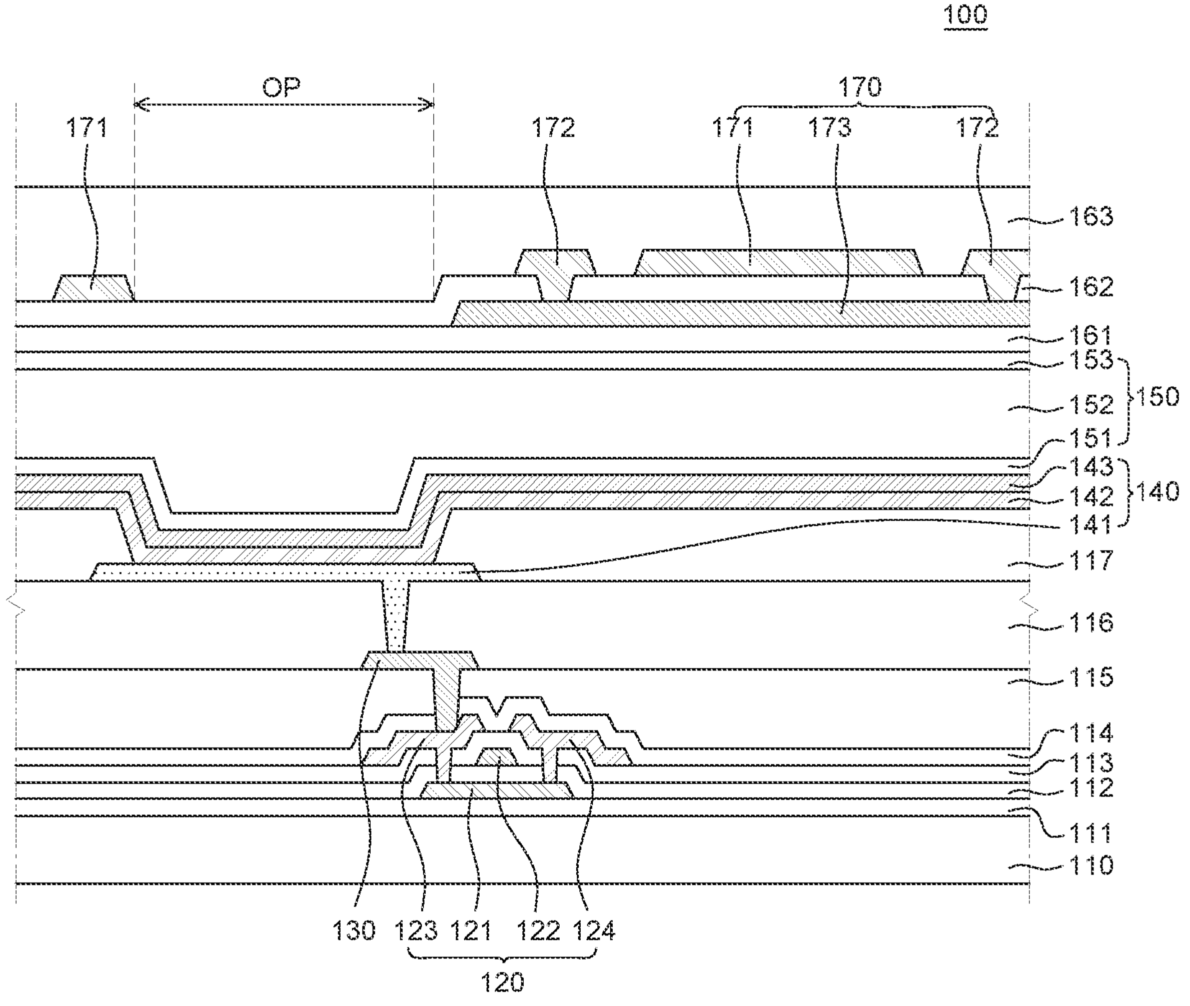
FIG. 2 is a schematic cross-sectional view of a portion of an active area of the display device of FIG. 1 according to an example embodiment of the present disclosure.

FIG. 2 is a schematic cross-sectional view of a portion of an active area of the display device of FIG. 1. Specifically, FIG. 2 is a cross-sectional view illustrating an area corresponding to the opening OP of the mesh pattern of the touch electrodes 170 and the bridge electrode 173.

Referring to FIG. 2, the display device 100 includes a substrate 110, a transistor 120, the light emitting element 140, an encapsulation unit 150 and the touch electrodes 170.

A first buffer layer 111 is disposed on the substrate 110. The first buffer layer 111 can reduce penetration of moisture or impurities through the substrate 110. In addition, the first buffer layer 111 can protect the transistor 120 from impurities such as alkali ions flowing out of the substrate 110. In addition, the first buffer layer 111 can improve adhesion between layers formed thereon and the substrate 110. The first buffer layer 111 can be formed of, for example, a single layer or multilayers of silicon oxide (SiOx) or silicon nitride (SiNx), but is not limited thereto.

The transistor 120 is disposed on the first buffer layer 111. The transistor 120 can drive the light emitting element 140. The transistor 120 can include an active layer 121, a gate electrode 122, a source electrode 123, and a drain electrode 124.

The active layer 121 is disposed on the first buffer layer 111. The active layer 121 is an area where a channel is formed when the transistor 120 is driven. The active layer 121 can include a channel region, a source region, and a drain region. The active layer 121 can be formed of a semiconductor material, such as an oxide semiconductor, amorphous silicon, or polysilicon, but is not limited thereto.

A gate insulating layer 112 is disposed on the active layer 121. The gate insulating layer 112 can insulate the active layer 121 and the gate electrode 122. Contact holes for respectively connecting the source electrode 123 and the drain electrode 124 to the active layer 121 can be formed in the gate insulating layer 112. The gate insulating layer 112 can be formed of a single layer or multiple layers of silicon oxide (SiOx) or silicon nitride (SiNx), but is not limited thereto.

The gate electrode 122 is disposed on the gate insulating layer 112. The gate electrode 122 is disposed on the gate insulating layer 112 to overlap the channel region of the active layer 121. The gate electrode 122 can be formed of a conductive material, such as copper (Cu), aluminum (Al), molybdenum (Mo), nickel (Ni), titanium (Ti), chromium (Cr), or an alloy thereof, but is not limited thereto.

A first interlayer insulating layer 113 is disposed on the gate electrode 122. Contact holes for respectively connecting the source electrode 123 and the drain electrode 124 to the active layer 111 are formed in the first interlayer insulating layer 113. The first interlayer insulating layer 113 can be formed of a single layer or multiple layers of silicon oxide (SiOx) or silicon nitride (SiNx), but is not limited thereto.

The source electrode 123 and the drain electrode 124 are disposed on the first interlayer insulating layer 113 to be spaced apart from each other. The source electrode 123 and the drain electrode 124 are electrically connected to the active layer 121 through the contact holes of the gate insulating layer 112 and the first interlayer insulating layer 113. The source electrode 123 and the drain electrode 124 can be formed of a conductive material, such as copper (Cu), aluminum (Al), molybdenum (Mo), nickel (Ni), titanium (Ti), chromium (Cr), or an alloy thereof, but the present disclosure is not limited thereto.

A passivation layer 114 is disposed on the transistor 120. The passivation layer 114 can insulate the transistor 120 and components thereon. The passivation layer 114 can be formed of a single layer or multiple layers of silicon oxide (SiOx) or silicon nitride (SiNx), but is not limited thereto.

A first planarization layer 115 and a second planarization layer 116 are disposed on the passivation layer 114. The first planarization layer 115 and the second planarization layer 116 are insulating layers that planarize an upper portion of the substrate 110. The first planarization layer 115 can include a contact hole for electrically connecting the transistor 120 and a first auxiliary electrode 130 to each other. Specifically, the first planarization layer 115 can include a contact hole exposing either one of the source electrode 123 and the drain electrode 124 of the transistor 120. The second planarization layer 116 can include a contact hole for electrically connecting the first auxiliary electrode 130 and an anode 141. The first planarization layer 115 and the second planarization layer 116 can be formed of an organic material, for example, can be formed of a single layer or multilayers of polyimide or photo acrylic, but the present disclosure is not limited thereto.

The first auxiliary electrode 130 is disposed between the first planarization layer 115 and the second planarization layer 116. The first auxiliary electrode 130 can connect the source electrode 123 of the transistor 120 and the anode 141 of the light emitting element 140. Although the first auxiliary electrode 130 is illustrated as being connected to the source electrode 123 in FIG. 2, the first auxiliary electrode 130 can be connected to the drain electrode 124. The first auxiliary electrode 130 can be formed of a conductive material, such as copper (Cu), aluminum (Al), molybdenum (Mo), nickel (Ni), titanium (Ti), chromium (Cr), or an alloy thereof, but is not limited thereto.

The light emitting element 140 is disposed on the second planarization layer 116. The light emitting element 140 can be disposed to correspond to the opening OP formed by the mesh pattern of the touch electrodes 170. The light emitting element 140 includes the anode 141, an organic layer 142 and a cathode 143.

Meanwhile, the display device 100 can be implemented as a top emission type or a bottom emission type. In the situation of the top emission type, a reflective layer for reflecting light emitted from the organic layer 142 toward the cathode 143 can be disposed under the anode 141. For example, the reflective layer can include a material having excellent reflectivity such as aluminum (Al) or silver (Ag), but is not limited thereto. Conversely, in the situation of the bottom emission type, the anode 141 can be formed of only a transparent conductive material. Hereinafter, descriptions are made assuming that the display device 100 according to an example embodiment of the present disclosure is a top emission type.

The anode 141 is disposed on the second planarization layer 116. The anode 141 can correspond to each of the plurality of sub-pixels. For example, the anode 141 can be disposed to correspond to the opening OP. In addition, the anode 141 can be patterned to correspond to each of the plurality of sub-pixels one by one. The anode 141 can be electrically connected to the first auxiliary electrode 130 and the source electrode 123 of the transistor 120 through the contact holes formed in the second planarization layer 116 and the first planarization layer 115. The anode 141 can be formed of a conductive material having a high work function, in order to supply holes to the organic layer 142. For example, the anode 141 can be formed of a transparent conductive material, such as indium tin oxide (ITO) or indium zinc oxide (IZO), but is not limited thereto.

A bank 117 is disposed on the anode 141 and the second planarization layer 116. The bank 117 can be formed on the second planarization layer 116 to cover an edge of the anode 141. The bank 117 is an insulating layer disposed between the plurality of sub-pixels to distinguish the plurality of sub-pixels. The bank 117 can be an organic insulating material. For example, the bank 117 can be formed of polyimide, acryl, or benzocyclobutene (BCB)-based resin, but is not limited thereto.

The organic layer 142 is disposed on the anode 141 and the bank 117. The organic layer 142 can be formed over an entire surface of the substrate 110. For example, the organic layer 142 can be a common layer commonly formed in the plurality of sub-pixels, but is not limited thereto. The organic layer 142 can be an organic layer for emitting light of a specific color. The organic layer 142 can include various layers such as a light emitting layer, a hole transport layer, a hole injection layer, a hole blocking layer, an electron injection layer, an electron blocking layer, an electron transport layer, and the like.

The cathode 143 is disposed on organic layer 142. The cathode 143 can be formed as a single layer over the entire surface of the substrate 110. For example, the cathode 143 can be a common layer commonly formed in or across the plurality of sub-pixels. Since the cathode 143 supplies electrons to the organic layer 142, it can be formed of a conductive material having a low work function. The cathode 143 can be formed of, for example, a transparent conductive material, such as indium tin oxide (ITO) or indium zinc oxide (IZO), a metal alloy such as MgAg, or an ytterbium (Yb) alloy, and can further include a metal-doped layer, but the present disclosure is not limited thereto.

The encapsulation unit 150 is disposed to cover the light emitting element 140. The encapsulation unit 150 protects the light emitting element 140 from moisture penetrating from the outside of the display device 100. The encapsulation unit 150 includes a first encapsulation layer 151, a foreign material cover layer 152, and a second encapsulation layer 153.

The first encapsulation layer 151 can be disposed on the cathode 143 to suppress penetration of moisture or oxygen. The first encapsulation layer 151 can be formed of an inorganic material, such as silicon nitride (SiNx), silicon oxynitride (SiNxOy), or aluminum oxide (AlyOz), but is not limited thereto.

The foreign material cover layer 152 is disposed on the first encapsulation layer 151 to planarize a surface thereof. In addition, the foreign material cover layer 152 can cover foreign matter or particles that can occur in a manufacturing process. The foreign material cover layer 152 can be formed of an organic material, such as silicon oxycarbon (SiOxCz), acrylic or epoxy-based resin, but is not limited thereto.

The second encapsulation layer 153 is disposed on the foreign material cover layer 152 and, similar to the first encapsulation layer 151, can suppress penetration of moisture or oxygen. In this situation, the second encapsulation layer 153 and the first encapsulation layer 151 can be formed to seal the foreign material cover layer 152. Accordingly, moisture or oxygen penetrating into the light emitting element 140 by the second encapsulation layer 153 can be more effectively reduced. The second encapsulation layer 153 can be formed of an inorganic material, such as silicon oxide (SiOx), silicon nitride (SiNx), silicon oxynitride (SiNxOy), or aluminum oxide (AlyOz), but is not limited thereto.

A second buffer layer 161 is disposed on the encapsulation unit 150. The second buffer layer 161 can reduce penetration of moisture or impurities. The second buffer layer 161 can be formed of a single layer or multiple layers of silicon oxide (SiOx) or silicon nitride (SiNx), but is not limited thereto.

The bridge electrodes 173 are disposed on the second buffer layer 161. The bridge electrode 173 can electrically connect the second touch electrodes 172 that are separated in the second direction. Further, the bridge electrode 173 can overlap with a portion of the first touch electrode 171. In this situation, the bridge electrode 173 is formed on a different layer than the first touch electrode 171. Specifically, the bridge electrode 173 can be disposed below the first touch electrode 171 that is continuously formed to electrically connect the separated second touch electrodes 172. Accordingly, the first touch electrodes 171 and the second touch electrodes 172 that are formed to cross over each other can be electrically insulated from each other.

A second interlayer insulating layer 162 is disposed on the second buffer layer 161 and the bridge electrode 173. The second interlayer insulating layer 162 can electrically insulate the bridge electrode 173 and the first touch electrode 171 from each other. The second interlayer insulating layer 162 can include a contact hole through which the second touch electrode 172 and the bridge electrode 173 are connected to each other. The second interlayer insulating layer 162 can be formed of a single layer or multiple layers of silicon oxide (SiOx) or silicon nitride (SiNx), but is not limited thereto.

The first touch electrode 171 and the second touch electrode 172 are disposed on the second interlayer insulating layer 162. The first touch electrode 171 and the second touch electrode 172 can be spaced apart from each other by a predetermined distance on the second interlayer insulating layer 162. The first touch electrodes 171 can be formed to continuously extend in the first direction on the second interlayer insulating layer 162. The second touch electrodes 172 can be formed to extend in the second direction on the second interlayer insulating layer 162. The second touch electrodes 172 can be separated in areas where they overlap the first touch electrodes 171. The separated second touch electrodes 172 can be connected by the bridge electrode 173.

A third planarization layer 163 can be disposed to cover the first touch electrodes 171, the second touch electrodes 172, and the second interlayer insulating layer 162. The third planarization layer 163 can planarize upper portions of the touch electrodes 170. The third planarization layer 163 can be formed of an organic material, and can include, for example, a single layer or multilayers of polyimide or photoacryl, but is not limited thereto.

Figure 3:
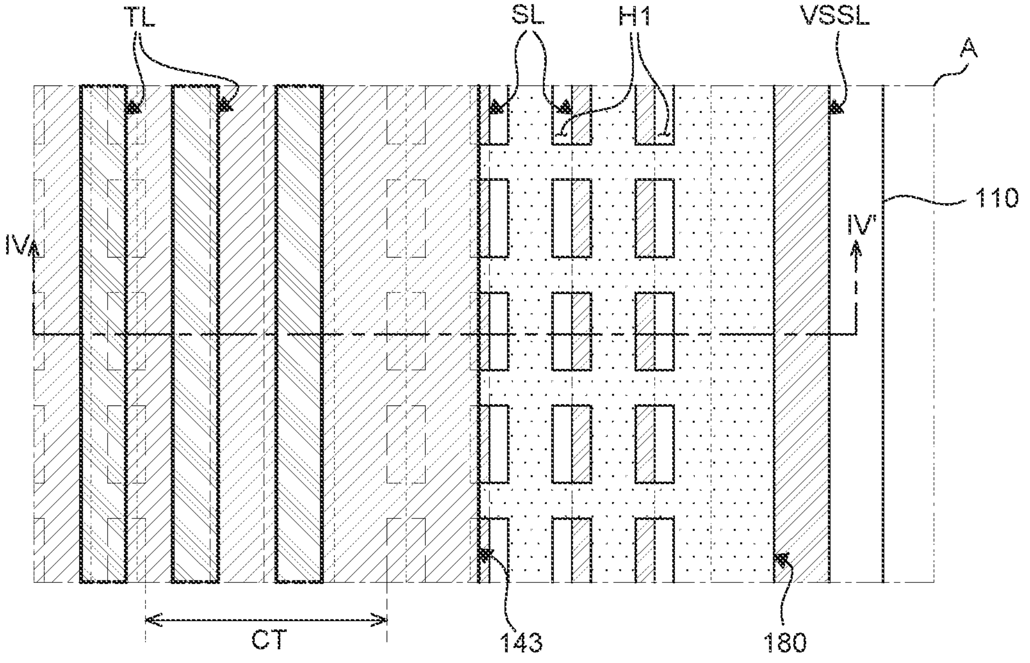
FIG. 3 is an enlarged plan view of area A of FIG. 1 according to an example embodiment of the present disclosure.
Figure 4:
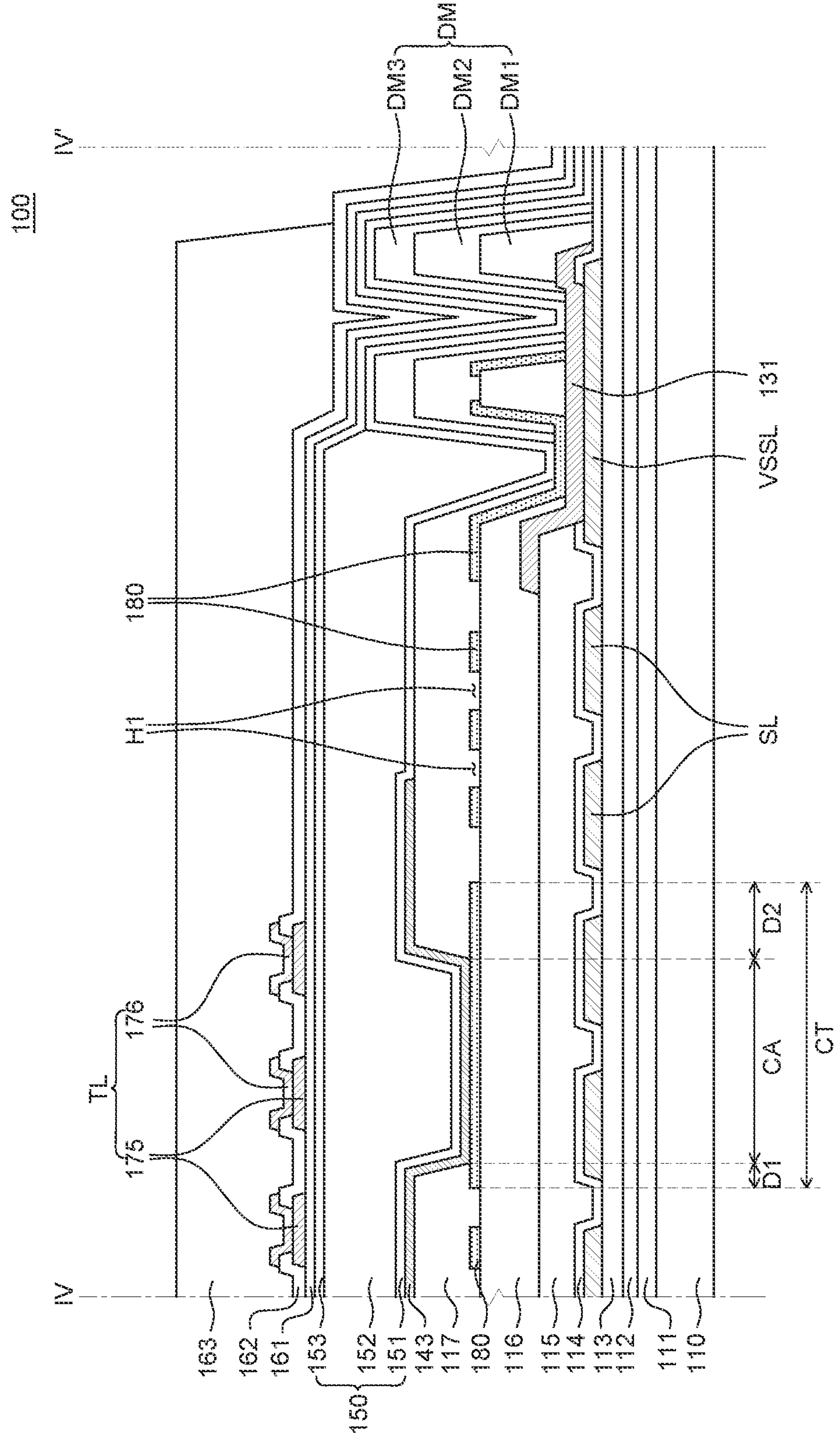
FIG. 4 is a cross-sectional view of IV-IV' of FIG. 3 according to an example embodiment of the present disclosure.

FIG. 3 is an enlarged plan view of area A of FIG. 1. FIG. 4 is a cross-sectional view of IV-IV' of FIG. 3. Each of FIGS. 3 and 4 is a schematic view of a portion of the non-active area NA of the display device 100. In FIG. 3, among components of the display device 100, only the substrate 110, a plurality of signal lines SL, a low potential power line VSSL, a connection electrode 180, the cathode 143, and the plurality of touch routing lines TL are briefly shown for convenience of description.

The plurality of signal lines SL are disposed on the first interlayer insulating layer 113 in the non-active area NA. The plurality of signal lines SL can be formed of the same material through the same process as the source electrode 123 and the drain electrode 124. Meanwhile, a gate driver that is electrically connected to the plurality of sub-pixels of the active area AA to drive the plurality of sub-pixels can be disposed in the non-active area NA. The plurality of signal lines SL can be clock lines that are connected to the gate driver and transmit driving signals for driving the plurality of sub-pixels.

The low potential power line VSSL can be disposed in a circumferential portion of the substrate 110 at an outermost portion of the non-active area NA. The low potential power line VSSL is disposed on the first interlayer insulating layer 113. For example, the low potential power line VSSL can be formed of the same material through the same process as the plurality of signal lines SL, the source electrode 123 and the drain electrode 124. The low potential power line VSSL can be electrically connected to the cathode 143 through a second auxiliary electrode 131 and the connection electrode 180. Accordingly, the low potential power line VSSL can supply a low potential voltage to the cathode 143.

The second auxiliary electrode 131 is disposed on the low potential power line VSSL (e.g., see FIG. 4). A portion of the second auxiliary electrode 131 can be disposed between the first planarization layer 115 and the second planarization layer 116. For example, the second auxiliary electrode 131 can be formed of the same material as the first auxiliary electrode 130 through the same process. The second auxiliary electrode 131 can extend on the low potential power line VSSL between the first planarization layer 115 and the second planarization layer 116.

The connection electrode 180 is disposed on the second planarization layer 116 in the non-active area NA. The connection electrode 180 can be formed of the same material through the same process as the anode 141. The connection electrode 180 can be formed entirely on the second planarization layer 116 of the non-active area NA, but the present disclosure is not limited thereto. The connection electrode 180 is electrically connected to the cathode 143 in a contact area CA. Here, the contact area CA can mean an area where the connection electrode 180 and the cathode 143 are direct in contact with each other. The connection electrode 180 is electrically connected to the low potential power line VSSL via the second auxiliary electrode 131 which is disposed in the outermost portion of the non-active area NA. Accordingly, the connection electrode 180 can supply the low potential voltage supplied through the low potential power line VSSL to the cathode 143.

The connection electrode 180 can include a plurality of first holes H1. Gas generated in the first planarization layer 115 or the second planarization layer 116 under the connection electrode 180 during the manufacturing process can be easily discharged to the outside through the plurality of first holes H1. For example, outgassing from layers under the connection electrode 180 can be vented through the plurality of first holes H1. The plurality of first holes H1 can be arranged in a grid pattern, but embodiments are not limited thereto.

The connection electrode 180 includes a contact portion CT that is in contact with the cathode 143 in the contact area CA. The contact portion CT can include an area that is in direct contact with the cathode 143 of the connection electrode 180 and a portion of a periphery thereof. Further, the contact portion CT can refer to a portion in which the connection electrode 180 is entirely formed on the second planarization layer 116 without having the plurality of first holes H1 formed therein. For example, the connection electrode 180 can include a large solid section that fully contacts with the connection electrode 180 that is free of any holes.

A first distance D1 between one end of the contact portion CT adjacent to the active area AA and the contact area CA is shorter than a second distance D2 between the other end of the contact portion CT adjacent to an outer portion of the non-active area NA and the contact area CA. For example, the contact portion CT can extend farther toward the outer portion of the non-active area NA from the contact area CA. Accordingly, the contact portion CT can have a shape in which one end of the contact portion CT is longer than the other end of the contact area CA. In particular, the other end of the contact portion CT can extend longer or farther to the outer portion of the non-active area NA than an area where the plurality of touch routing lines TL are disposed. Further, the contact portion CT can overlap with a portion of the plurality of touch routing lines TL. Accordingly, the contact portion CT can shield noise between the plurality of touch routing lines TL and the plurality of signal lines SL. For example, the large solid section of the connection electrode 180 that fully contacts with the connection electrode 180 that is free of any holes can be disposed between the plurality of touch routing lines TL and the plurality of signal lines SL.

The cathode 143 can extend from the active area AA to the non-active area NA to come into direct contact with the contact portion CT of the connection electrode 180. The cathode 143 can extend farther to the outer portion of the non-active area NA than the area where the plurality of touch routing lines TL are disposed. Further, the cathode 143 can overlap with the plurality of touch routing lines TL. Accordingly, the cathode 143 can also shield noise between the plurality of touch routing lines TL and the plurality of signal lines SL. For example, together the cathode 143 and the connection electrode 180 can shield noise and prevent interference between the plurality of touch routing lines TL and the plurality of signal lines SL.

The plurality of touch routing lines TL are disposed on the second buffer layer 161 in the non-active area NA. The plurality of touch routing lines TL include first line layers 175 and second line layers 176. Since the plurality of touch routing lines TL have a structure in which the first line layer 175 and the second line layer 176 are stacked on each other, resistance of the lines can be reduced. For example, the plurality of touch routing lines TL can have a double layer structure that reduces electrical resistance.

The first line layers 175 are disposed on the second buffer layer 161. The first line layer 175 can be formed of the same material as the bridge electrode 173 and through the same process. The second line layer 176 is disposed on the first line layer 175. The second line layer 176 can be electrically connected to the first line layer 175 through a contact hole formed in the second interlayer insulating layer 162. The second line layer 176 can be formed of the same material as the first touch electrode 171 and the second touch electrode 172, and formed through the same process.

A portion of the plurality of touch routing lines TL can overlap with the first hole H1 in the connection electrode 180. In addition, a portion of the plurality of signal lines SL disposed below the connection electrode 180 can also overlap with the first hole H1 in the connection electrode 180. In this situation, the plurality of touch routing lines TL overlap the cathode 143 extending to the non-active area NA. For example, the cathode 143 can be disposed between the plurality of touch routing lines TL and the plurality of first holes H1 of the connection electrode 180. Accordingly, coupling of electrical signals of the plurality of signal lines SL and the plurality of touch routing lines TL through the plurality of first holes H1 can be prevented since it is shielded by the cathode 143.

A plurality of dams DM are disposed in an area adjacent to an end of the substrate 110. The plurality of dams DM can prevent a foreign material cover layer 152 from overflowing. Each of the plurality of dams DM can have a structure in which a first layer DM1, a second layer DM2, and a third layer DM3 are stacked on each other. The first layer DM1 can be formed of the same material as the second planarization layer 116 and through the same process. The second layer DM2 can be formed of the same material as the bank 117 and through the same process. The third layer DM3 can be formed of an organic material, and can be formed of polyimide, acryl, or benzocyclobutene (BCB)-based resin, but is not limited thereto.

In general, a cathode and a low potential power line can be electrically connected to each other by a connection electrode in an outer portion of a non-active area. In this situation, the connection electrode can be formed with a large area to prevent an increase in electrical resistance. However, gas generated during a manufacturing process can remain trapped in an organic layer below the connection electrode, and a plurality of holes can be formed in the connection electrode to discharge or vent the gas. In this situation, signal lines disposed below the connection electrode and touch routing lines disposed above the connection electrode can overlap with each other due to the plurality of holes. In this situation, a signal of the signal line and a signal of the touch routing line are coupled, and thus, noise and interference can be generated in touch sensing, which causes a defect in the display device and degrades quality thereof.

In the display device 100 according to an example embodiment of the present disclosure, the cathode 143 overlaps with the plurality of touch routing lines TL and the plurality of signal lines SL, thereby shielding noise that can be introduced into the plurality of touch routing lines TL. Specifically, the cathode 143 can extend from the active area AA to the area of the non-active area NA where the plurality of touch routing lines TL are disposed. In particular, an end of the cathode 143 can be disposed closer to the end of the substrate 110 than an outermost touch routing line TL among the plurality of touch routing lines TL. Therefore, even if the touch routing line TL and the first hole H1 of the connection electrode 180 do overlap with each other, the cathode 143 can be disposed between the touch routing line TL and the first hole H1 that overlap each other. For example, even if the touch routing line TL, the first hole H1, and the signal line SL overlap one another, noise can be shielded by the cathode 143. In this way, the signal line SL and the touch routing line TL can still be shielded from each other, and the connection electrode 180 can include holes for venting any outgassing from layers disposed under the connection electrode 180.

The contact portion CT of the connection electrode 180 can be formed such that the other end thereof adjacent to the outer portion of the non-active area NA is longer than the one side thereof adjacent to the active area AA. For example, the contact portion CT can extend longer toward the end of the substrate 110 from the contact area CA than the other end that extends toward the active area AA. In particular, the other end of the contact portion CT can be disposed closer to the end of the substrate 110 than the outermost touch routing line TL. In this situation, the contact portion CT can overlap with the outermost touch routing line TL. Further, the contact portion CT can overlap with at least one of the plurality of signal lines SL. Therefore, an effect of shielding noise between the plurality of touch routing lines TL and the plurality of signal lines SL can be further improved by the contact portion CT which can block interference between the plurality of signal lines SL and the plurality of touch routing lines TL.

Figure 5:
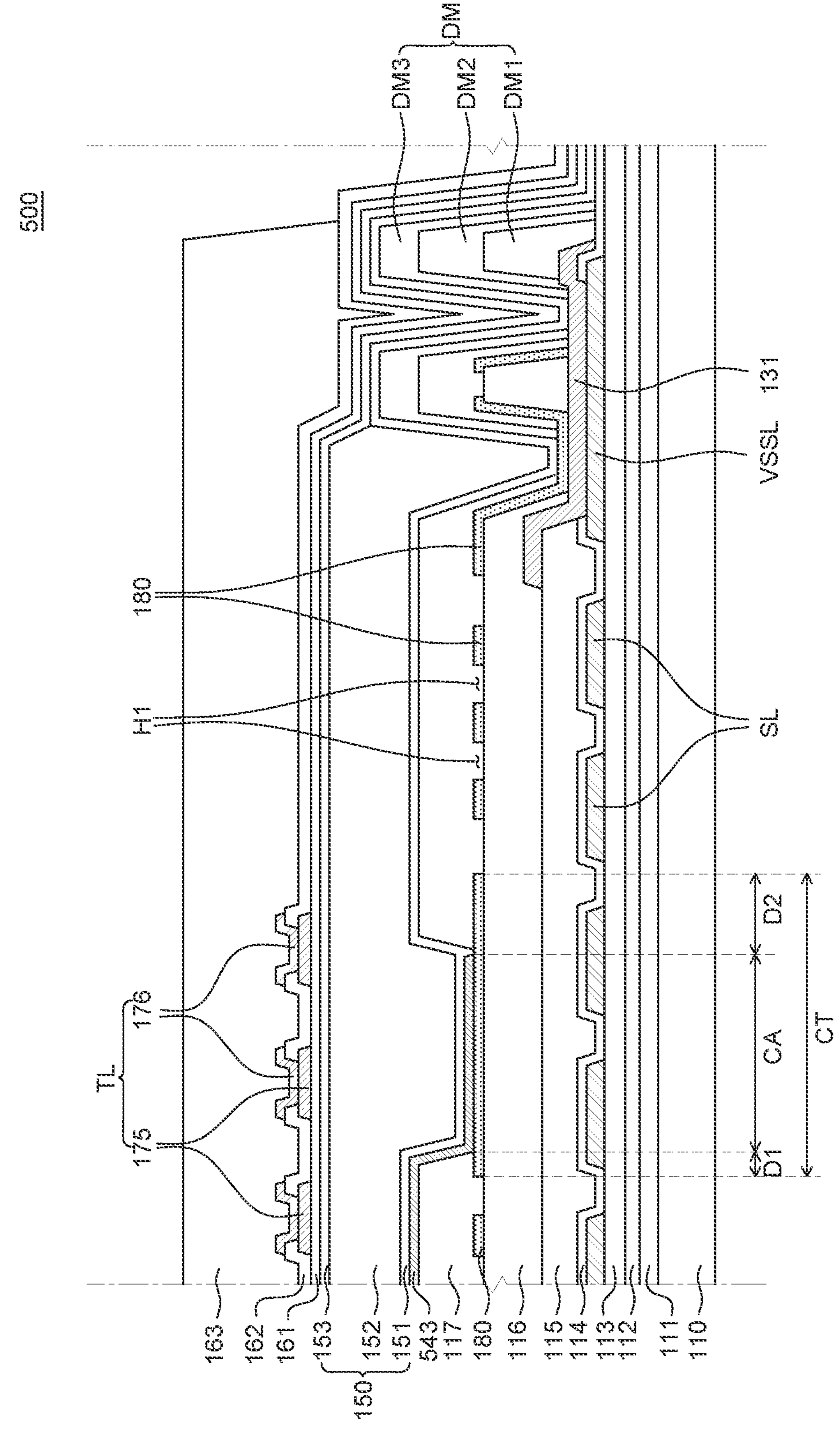
FIG. 5 is a cross-sectional view of a display device according to another example embodiment of the present disclosure according to an example embodiment of the present disclosure.

FIG. 5 is a cross-sectional view of a display device according to another example embodiment of the present disclosure. A display device 500 of FIG. 5 can be different than the display device 100 of FIGS. 1 to 4 only in terms of a cathode 543. For example, the cathode 543 in FIG. 5 is shorter than the cathode 143 in FIG. 4, in which the cathode 543 can terminate before extending pass an outer edge of the contact portion CT of the connection electrode 180. Accordingly, redundant descriptions will be omitted.

Referring to FIG. 5, the cathode 543 extends from the active area AA to an area overlapping with a portion of the plurality of touch routing lines TL. Specifically, the cathode 543 can overlap with only a portion of an outermost touch routing line TL among the plurality of touch routing lines TL. Accordingly, the outermost touch routing line TL and a portion of the plurality of signal lines SL can overlap with each other in an outside of the cathode 543. Meanwhile, in FIG. 5, it is illustrated that the cathode 543 overlaps with a portion of the outermost touch routing line TL, but the present disclosure is not limited thereto. For example, the cathode 543 may not completely overlap with the outermost touch routing line TL or may not overlap with the plurality of touch routing lines TL disposed in the outer portion.

The contact portion CT has a second distance D2 longer than a first distance D1. Further, the other end of the contact portion CT adjacent to the outer portion of the non-active area NA extends a longer distance toward the outer portion of the non-active area NA than an end of the cathode 543. In particular, the contact portion CT can be disposed to completely overlap with the outermost touch routing line TL while the cathode 543 can partially overlap with the outermost touch routing line TL. Accordingly, the contact portion CT can be disposed between the outermost touch routing line TL and the signal line SL, which overlap with each other. In addition, only the bank 117 which is an insulating layer, the encapsulation unit 150, and the second buffer layer 161 are disposed between the outermost touch routing line TL and the contact portion CT in the area outside of the cathode 543. Accordingly, it is possible to prevent introduction of unnecessary signals into the outermost touch routing line TL (e.g., such as interference from the signal line SL).

In other words, the cathode 543 is used as a shielding layer to reduce noise between signal lines through a plurality of holes formed in a connection electrode. In particular, the cathode 543 can serve as a shielding layer up to a contact area where the cathode and the connection electrode contact each other in order to supply a low potential voltage. However, there can be situations in which a position of the cathode is shifted or the cathode is formed shorter due to a process margin. For example, coupling between signal lines can occur in the area outside the cathode (e.g., the area where the cathode is not located between the signal lines and the touch routing lines).

The display device 500 according to another example embodiment of the present disclosure can use the contact portion CT of the connection electrode 180 as a shielding layer for shielding coupling between the plurality of touch routing lines TL and the plurality of signal lines SL. Specifically, the other end of the contact portion CT can extend a longer distance away from the contact area CA than one end thereof based on the contact area CA. Further, the other end of the contact portion CT extends a longer distance toward the outer portion of the non-active area NA than the other end of the cathode 543 extends toward the active area AA. Accordingly, even if a portion of the plurality of touch routing lines TL and a portion of the plurality of signal lines SL overlap with each other in the area outside of the cathode 543, the contact portion CT can still be disposed between the touch routing line TL and the signal line SL that overlap with each other, in order to provide sufficient shielding. Therefore, noise between the plurality of touch routing lines TL and the plurality of signal lines SL is reduced, and thus, quality of the display device 500 and the accuracy of touch sensing can be improved.

Figure 6A:
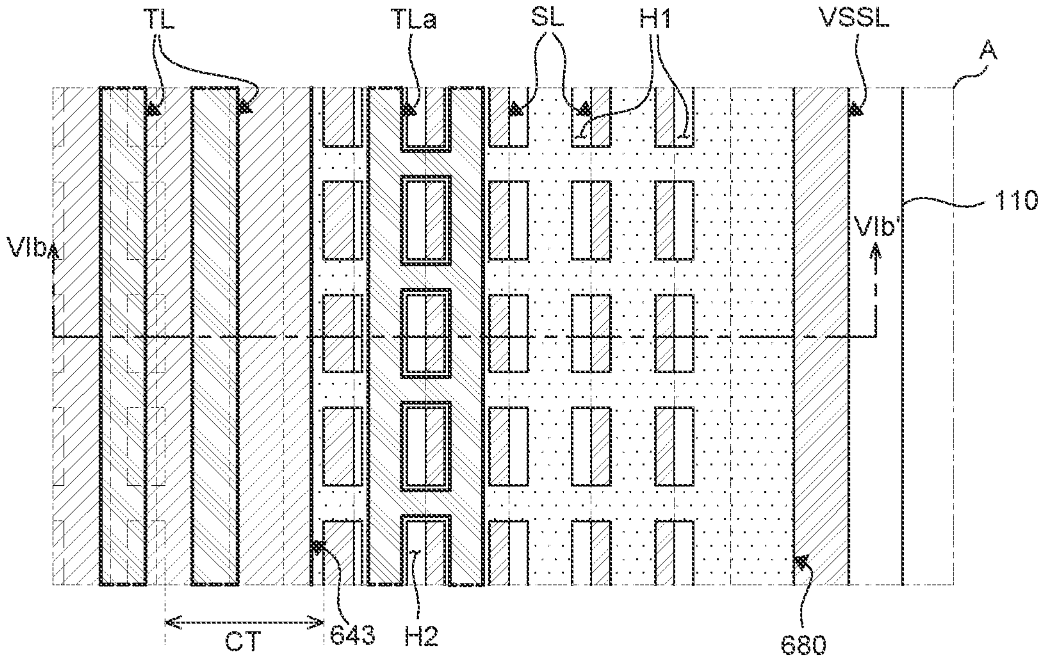
FIG. 6A is a plan view of a display device according to still another example embodiment of the present disclosure.
Figure 6B:
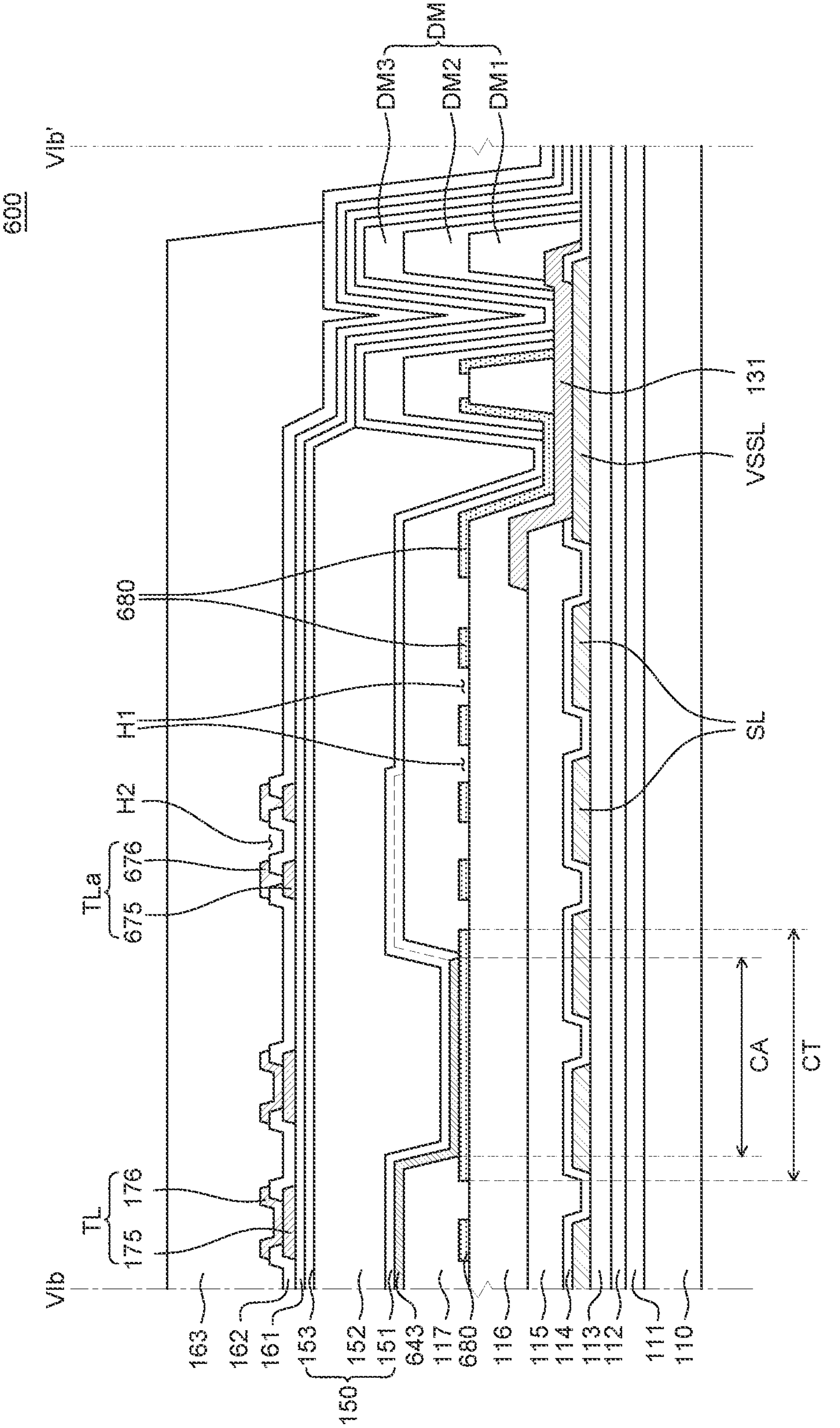
FIG. 6B is a cross-sectional view taken along VIb-VIb' of FIG. 6A according to an example embodiment of the present disclosure.

FIG. 6A is a plan view of a display device according to still another example embodiment of the present disclosure. FIG. 6B is a cross-sectional view taken along VIb-VIb' of FIG. 6A. A display device 600 of FIGS. 6A and 6B can be different from the display device 500 of FIG. 5 only in terms of a plurality of touch routing lines TL. For example, similar to the plurality of first holes H1 in the connection electrode 180 in the display device 500 of FIG. 5, an outermost touch routing line TLa in the display device 600 of FIGS. 6A and 6B can include a plurality of second holes H2. Accordingly, redundant descriptions will be omitted.

Referring to FIGS. 6A and 6B, an outermost touch routing line TLa disposed at an outermost portion of the plurality of touch routing lines TL includes a plurality of second holes H2. The plurality of second holes H2 can correspond to a plurality of first holes H1 of a connection electrode 680 overlapping with the outermost touch routing line TLa. In other words, each of the second holes H2 in the outermost touch routing line TLa can be aligned with and overlap with a corresponding one of the plurality of first holes H1 in connection electrode 680. Also, a center of each of the second holes H2 can be aligned with a center of one of the first holes H1, but embodiments are not limited thereto. For example, the outermost touch routing line TLa can be formed along a shape of the connection electrode 680 therebelow. Further, the outermost touch routing line TLa can be formed to completely overlap with the connection electrode 680. In this situation, the outermost touch routing line TLa can be disposed in an area outside of the contact portion CT (e.g., located closer to an outer edge of the display device 600). For example, the outermost touch routing line TLa can include the plurality of second holes H2 corresponding to the plurality of first holes H1 in the outside of the contact portion CT. Also, the plurality of second holes H2 can have a same shape and a same size as the plurality of first holes H1, but embodiments are not limited thereto. For example, the plurality of second holes H2 can be larger than or smaller than the plurality of first holes H1 and have different shapes, according to embodiments.

In the same manner as that of other touch routing lines TL, the outermost touch routing line TLa can be formed in a multilayer structure of a first line layer 675 and a second line layer 676 (e.g., can have a dual layer structure to lower resistance). The outermost touch routing line TLa can have a width greater than widths of other touch routing lines TL. For example, the outermost touch routing line TLa can be the widest touch routing line among the plurality of touch routing lines TL. Specifically, since the outermost touch routing line TLa includes the plurality of second holes H2, it can have a relatively small area. Thus, by making the width of the outermost touch routing line TLa greater than those of the other touch routing lines TL, an increase in resistance due to a decrease in area can be prevented.

Meanwhile, in the display device 600 according to still another example embodiment of the present disclosure, the contact portion CT of the connection electrode 680 can be formed symmetrically with respect to the contact area CA. For example, a distance between one end of the contact portion CT and the contact area CA can be similar to or same as a distance between the other end of the contact portion CT and the contact area CA (e.g., the overhang portions or extended portions on opposite sides of the contact area CA can be equal to each other). However, the present disclosure is not limited thereto, and if necessary, a shape of the contact portion CT can be formed as shown that in FIG. 5.

In addition, in the display device 600 according to still another example embodiment of the present disclosure, a cathode 643 is formed only up to an area corresponding to the contact portion CT, but the present disclosure is not limited thereto. For example, as indicated by dotted lines in FIG. 6B, the cathode 643 can be formed to extend a longer distance than the end of the contact portion CT.

In the situation of the outermost touch routing line, at least a portion of the outermost touch routing line can be disposed outside of the cathode due to a process margin of the cathode. For example, the outermost touch routing line can include an area that does not overlap with the cathode. In this situation, the outermost touch routing line can be exposed through the hole of the connection electrode. Further, the outermost touch routing line exposed through the hole of the connection electrode can overlap with the signal line therebelow. Therefore, coupling between the signal lines may occur.

In the display device 600 according to still another example embodiment of the present disclosure, the outermost touch routing line TLa can be disposed outside of the contact portion CT. Further, the outermost touch routing line TLa can include the plurality of second holes H2 corresponding to the plurality of first holes H1 of the connection electrode 680. For example, the outermost touch routing line TLa can be formed to have a shape corresponding to that of the connection electrode 680 overlapping with the outermost touch routing line TLa. Further, the outermost touch routing line TLa can completely overlap with the connection electrode 680. Therefore, even if the outermost touch routing line TLa and the signal line SL overlap with each other, the connection electrode 680 can be disposed between the outermost touch routing line TLa and the signal line SL, and the connection electrode 680 can effectively shield the outermost touch routing line TLa and the signal lines SL from each other. Accordingly, noise between the outermost touch routing line TLa and the signal line SL can be reduced by the connection electrode 680.

Figure 7A:
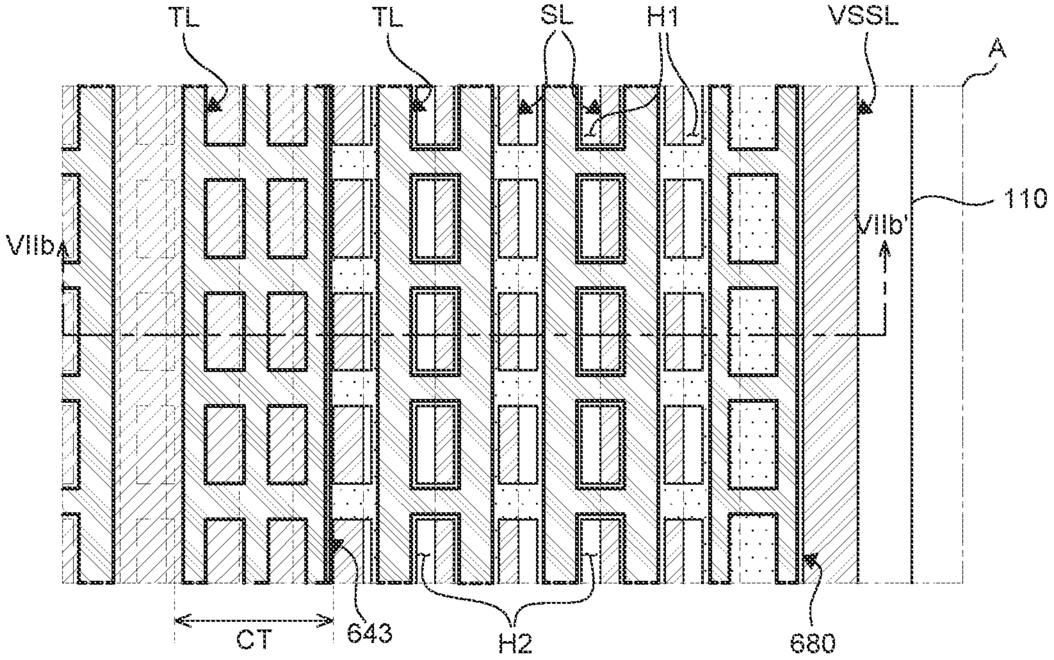
FIG. 7A is a plan view of a display device according to still another example embodiment of the present disclosure.
Figure 7B:
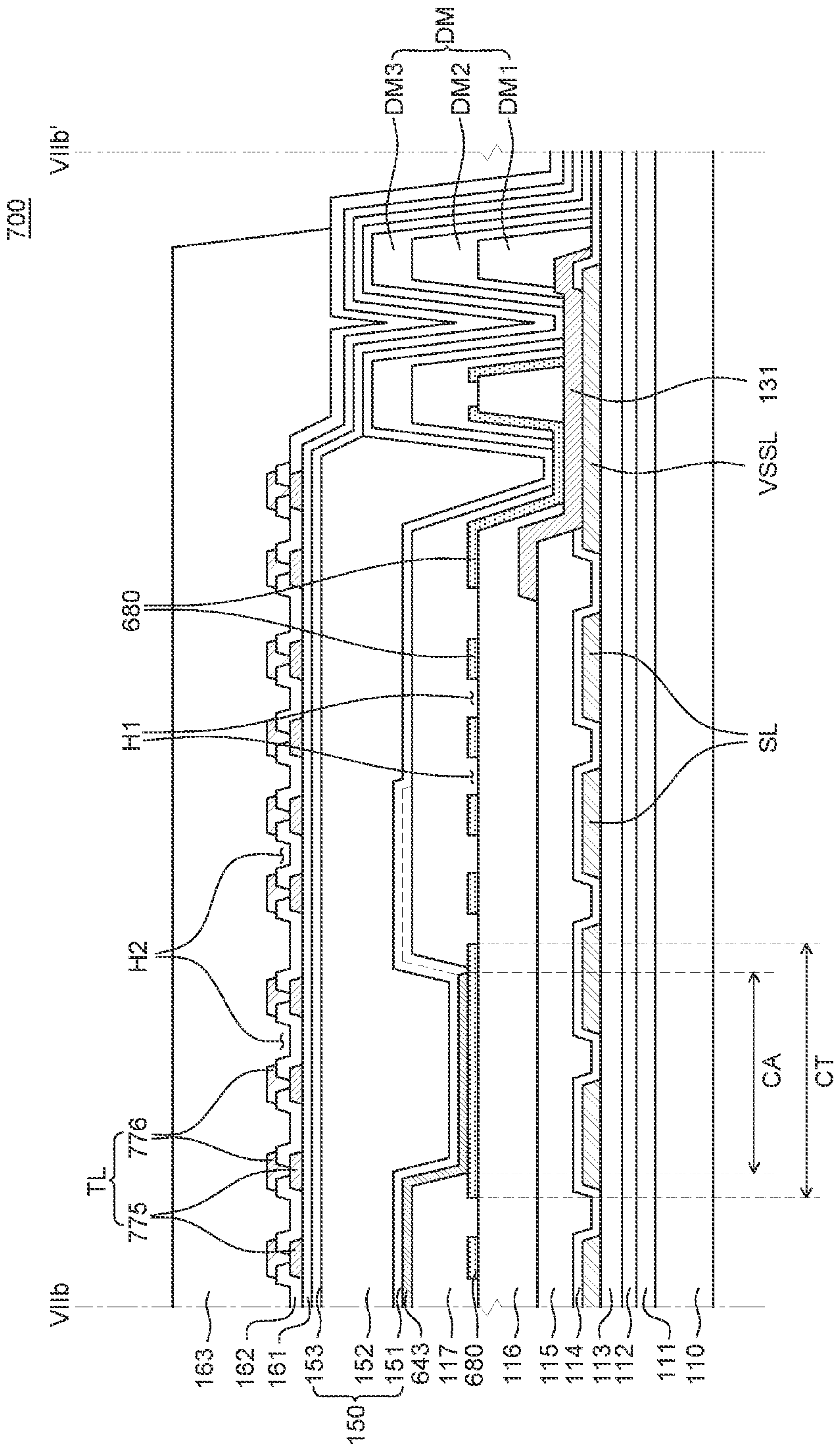
FIG. 7B is a cross-sectional view taken along VIIb-VIIb' of FIG. 7A according to an example embodiment of the present disclosure.

FIG. 7A is a plan view of a display device according to still another example embodiment of the present disclosure. FIG. 7B is a cross-sectional view taken along VIIb-VIIb' of FIG. 7A. A display device 700 of FIGS. 7A and 7B can be different from the display device 600 of FIGS. 6A and 6B, only in terms of a plurality of touch routing lines TL. Accordingly, redundant descriptions will be omitted.

Referring to FIGS. 7A and 7B, the plurality of touch routing lines TL can be formed in a multilayer structure of a first line layer 775 and a second line layer 776 (e.g., a dual layer structure). The plurality of touch routing lines TL include a plurality of second holes H2. The plurality of second holes H2 can correspond to the plurality of first holes H1 of the connection electrode 680 overlapping the plurality of touch routing lines TL. For example, the plurality of touch routing lines TL can be formed along the shape of the connection electrode 680 therebelow. Also, each the plurality of second holes H2 can be aligned with and overlap with one of the plurality of first holes H1. Further, the plurality of touch routing lines TL including the plurality of second holes H2 can be formed to completely overlap with the connection electrode 680.

In particular, a portion of the plurality of second holes H2 can be disposed outside of the cathode 643. The plurality of second holes H2 and the plurality of first holes H1 that are disposed outside the cathode 643 can overlap with each other. For example, in an area where the cathode 643 does not exist, the plurality of touch routing lines TL can include the plurality of second holes H2 corresponding to the plurality of first holes H1. Accordingly, in an area where the plurality of first holes H1 are formed, the plurality of signal lines SL and the plurality of touch routing lines TL do not overlap with each other. Accordingly, coupling between signals of the plurality of signal lines SL and the plurality of touch routing lines TL can be prevented by the connection electrode 680 disposed therebetween.

A portion of the plurality of touch routing lines TL can have a shape in which the plurality of second holes H2 are disposed in one column, and another portion of the plurality of second holes H2 can have a shape in which the plurality of second holes H2 are disposed in two columns. However, the present disclosure is not limited thereto. For example, if the plurality of touch routing lines TL completely overlap with the connection electrode 680, the plurality of second holes H2 can be disposed in three or more columns, and the plurality of second holes H2 may not be included in the plurality of touch routing lines TL.

FIGS. 7A and 7B show that all of the plurality of touch routing lines TL include the plurality of second holes H2, but the present disclosure is not limited thereto. For example, the plurality of second holes H2 can be formed only in an area where the plurality of first holes H1 are formed in an outside of the cathode 643. In this situation, the plurality of touch routing lines TL may not include the plurality of second holes H2 in the area where the plurality of first holes H1 are not formed. Alternatively, the plurality of touch routing lines TL may not include the plurality of second holes H2 in an area overlapping with the cathode 643. Alternatively, in the area overlapping the cathode 643, the plurality of second holes H2 and the plurality of first holes H1 can be disposed to offset from each other. For example, in an area where the cathode 643 is disposed, the cathode 643 can serve as a shielding layer between the plurality of signal lines SL and the plurality of touch routing lines TL. Accordingly, shapes of the plurality of touch routing lines TL in the area where the cathode 643 is disposed can be variously changed according to design.

In the display device 700 according to still another example embodiment of the present disclosure, the plurality of touch routing lines TL can include the plurality of second holes H2 corresponding to the plurality of first holes H1 of the connection electrode 680. In particular, the plurality of touch routing lines TL in which the plurality of second holes H2 are formed can be disposed in the area outside of the cathode 643. In the area outside of the cathode 643, the plurality of touch routing lines TL can be formed to have a shape corresponding to that of the connection electrode 680. Further, in the area outside of the cathode 643, the plurality of touch routing lines TL can completely overlap with the connection electrode 680. Accordingly, even if the plurality of signal lines SL and the plurality of touch routing lines TL overlap with each other in the area outside of the cathode 643, the connection electrode 680 can be disposed therebetween and effectively shield the plurality of touch routing lines TL from the plurality of signal lines SL. Accordingly, noise between the outermost touch routing line TLa and the signal line SL can be reduced or blocked by the connection electrode 680.

In the display device 700 according to still another example embodiment of the present disclosure, the plurality of touch routing lines TL can be formed in the area outside of the cathode 643. For example, the plurality of touch routing lines TL are formed along the shape of the connection electrode 680 in the outside of the cathode 643. Therefore, even if the cathode 643 serving as a shielding layer does not exist, the connection electrode 680 can serve as a shielding layer between the plurality of touch routing lines TL and the plurality of signal lines SL. Accordingly, an area where the plurality of touch routing lines TL can be formed can extend to the area outside of the cathode 643. Accordingly, a degree of freedom in designing the plurality of touch routing lines TL can be improved. In addition, since space utilization of the plurality of touch routing lines TL is improved, it is advantageous for implementing a narrow bezel.

In the display device 700 according to still another example embodiment of the present disclosure, the plurality of touch routing lines TL overlapping with the connection electrode 680 are disposed above the connection electrode 680 in the outermost portion of the non-active area NA. In this situation, the connection electrode 680 can be formed of the same material as the anode 141 and through the same process. Accordingly, even if the connection electrode 680 includes a reflective layer, reflection of light by the connection electrode 680 can be prevented by the plurality of touch routing lines TL, since the plurality of touch routing lines TL cover the connection electrode 680. Accordingly, defects in appearance or reflections of the display device 100 can be improved and quality can be improved.

The example embodiments of the present disclosure can also be described as follows:

According to an aspect of the present disclosure, a display device includes a substrate including an active area and a non-active area surrounding the active area; a light emitting element in the active area and including an anode, an organic layer, and a cathode; a connection electrode in the non-active area and disposed on the same layer as the anode; an encapsulation unit covering the light emitting element and the connection electrode; a plurality of touch electrodes on the encapsulation unit in the active area; and a plurality of touch routing lines in the non-active area and connected to the plurality of touch electrodes. The connection electrode includes a contact portion connected to the cathode in a contact area. The contact portion extends longer toward an outer portion of the non-active area from the contact area.

A distance between one end of the contact portion adjacent to the active area and the contact area can be shorter than a distance between the other end of the contact portion adjacent to the outer portion of the non-active area and the contact area.

An outermost touch routing line disposed at an outermost portion of the plurality of touch routing lines can overlap with the contact portion.

Only an insulating layer can be disposed between the outermost touch routing line and the contact portion in an outside of the cathode.

The connection electrode includes a plurality of holes. The cathode can be disposed between the plurality of holes and the plurality of touch routing lines.

The display device can further include a plurality of signal lines below the connection electrode in the non-active area. At least one of the plurality of signal lines can overlap the contact portion.

The display device can further include a gate driver in the non-active area. The plurality of signal lines can be clock lines connected to the gate driver.

An end of the contact portion can extend a longer distance toward the outer portion of the non-active area than an end of the cathode extends toward the active area.

The display device can further include a low potential power line in the non-active area. The connection electrode can be electrically connected to the low potential power line.

According to another aspect of the present disclosure, a display device includes a substrate including an active area and a non-active area surrounding the active area; a light emitting element in the active area and including an anode, an organic layer, and a cathode; a connection electrode in the non-active area and disposed on the same layer as the anode; an encapsulation unit covering the light emitting element and the connection electrode; a plurality of touch electrodes on the encapsulation unit in the active area; and a plurality of touch routing lines in the non-active area and connected to the plurality of touch electrodes. The connection electrode includes a plurality of first holes. At least one touch routing line overlapping the connection electrode among the plurality of touch routing lines includes a plurality of second holes corresponding to the plurality of first holes.

The touch routing line overlapping with the connection electrode can have a shape corresponding to a shape of the connection electrode.

The plurality of touch routing lines can include an outermost touch routing line disposed at an outermost portion thereof. The outermost touch routing line can include the plurality of second holes.

The connection electrode can include a contact portion connected to the cathode, and the outermost touch routing line can be disposed in an area outside of the contact portion.

The plurality of second holes can be disposed in an area outside of the cathode.

The cathode can be disposed between the plurality of first holes and the plurality of touch routing lines.

The display device can further include a plurality of signal lines below the connection electrode in the non-active area. The connection electrode can be disposed between the plurality of signal lines and the plurality of touch routing lines overlapping with each other.

The display device can further include a gate driver in the non-active area. The plurality of signal lines can be clock lines connected to the gate driver.

The display device can further include a low potential power line in the non-active area. The connection electrode can be electrically connected to the low potential power line.

Although the example embodiments of the present disclosure have been described in detail with reference to the accompanying drawings, the present disclosure is not limited thereto and can be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. A display device, comprising:

a light emitting element disposed in an active area of a substrate, the light emitting element including a first electrode, a light emitting layer, and a second electrode;

a connection electrode disposed in a non-active area of the substrate, the connection electrode being electrically connected to the second electrode of the light emitting element;

a plurality of touch routing lines disposed in the non-active area; and a plurality of signal lines disposed in the non-active area, wherein the connection electrode is disposed between the plurality of signal lines and the plurality of touch routing lines, and wherein at least one of the plurality of touch routing lines includes a hole overlapping with a hole in the connection electrode.

2. The display device of claim 1, wherein the at least one of the plurality of touch routing lines including the hole is an outermost touch routing line among the plurality of touch routing lines.

3. The display device of claim 1, wherein the first electrode is an anode electrode, and the second electrode is a cathode electrode.

4. The display device of claim 1, further comprising:

an encapsulation unit covering the light emitting element and the connection electrode; and a plurality of touch electrodes disposed on the encapsulation unit in the active area, wherein the second electrode extends into the non-active area and is disposed between the plurality of touch electrodes and the plurality of signal lines.

5. The display device of claim 1, wherein at least one of the plurality of signal lines includes a hole overlapping with at least one hole in the connection electrode or at least one hole in one of the plurality of touch routing lines.

6. The display device of claim 1, further comprising:

a gate driver disposed in the non-active area, wherein the plurality of signal lines include clock lines connected to the gate driver.

7. The display device of claim 1, further comprising:

a low potential power line disposed in the non-active area, wherein the connection electrode is electrically connected to the low potential power line.

8. The display device of claim 1, wherein the connection electrode includes a plurality of first holes, the hole in the connection electrode being included in the plurality of first holes, and wherein the at least one of the plurality of touch routing lines includes a plurality of second holes, the hole in the at least one of the plurality of touch routing lines being included in the plurality of second holes.

9. The display device of claim 1, wherein the connection electrode is disposed on a same layer as the second electrode.

10. A display device, comprising:

a light emitting element disposed in an active area of a substrate, the light emitting element including a first electrode, a light emitting layer, and a second electrode extending further towards a non-active area than the first electrode;

a connection electrode disposed in the non-active area of the substrate, the connection electrode being electrically connected to the second electrode of the light emitting element;

a plurality of touch routing lines disposed in the non-active area; and a plurality of signal lines disposed in the non-active area, wherein a contact area of the connection electrode directly contacts the second electrode of the light emitting element, wherein a first portion of the connection electrode extends away from the contact area in a direction toward the non-active area, and a second portion of the connection electrode extends away from the contact area in a direction toward the active area, wherein a first length of the first portion of the connection electrode is greater than a second length of the second portion of the connection electrode, and wherein the first portion, the contact area, and the second portion of the connection electrode are integrally formed as a single continuous solid piece free of holes.

11. The display device of claim 10, wherein the connection electrode is disposed between the plurality of signal lines and the plurality of touch routing lines.

12. The display device of claim 10, wherein the connection electrode includes one or more first holes, and wherein at least one of the plurality of touch routing lines includes one or more second holes.

13. The display device of claim 12, wherein at least one of the one or more first holes in the connection electrode overlaps with at least one of the one or more second holes in the at least one of the plurality of touch routing lines.

14. The display device of claim 13, wherein an outermost touch routing line among the plurality of touch routing lines includes the one or more second holes.

15. The display device of claim 14, wherein the outermost touch routing line is disposed in an area outside of the contact area.

16. The display device of claim 10, wherein at least one touch routing line among the plurality of touch routing lines has a shape corresponding to a shape of the connection electrode.

17. The display device of claim 10, further comprising:

a gate driver disposed in the non-active area, wherein the plurality of signal lines include clock lines connected to the gate driver.

18. The display device of claim 10, further comprising:

a low potential power line disposed in the non-active area, wherein the connection electrode is electrically connected to the low potential power line.

19. A display device, comprising:

a light emitting element disposed in an active area of a substrate, the light emitting element including a first electrode, a light emitting layer, and a second electrode;

a connection electrode disposed in a non-active area of the substrate, the connection electrode being electrically connected to the second electrode of the light emitting element;

a plurality of touch routing lines disposed in the non-active area; and a plurality of signal lines disposed in the non-active area, wherein a portion of the connection electrode overlaps with the second electrode, wherein the connection electrode includes a plurality of first holes, and wherein at least one touch routing line overlapping with the connection electrode among the plurality of touch routing lines includes a plurality of second holes overlapping with the plurality of first holes in the connection electrode.

20. The display device of claim 19, wherein the connection electrode is configured to shield the plurality of touch routing lines from noise generated by the plurality of signal lines.

21. The display device of claim 19, wherein a contact area of the connection electrode directly contacts the second electrode of the light emitting element, and wherein a first portion of the connection electrode extends away from the contact area in a direction toward the non-active area.

22. The display device of claim 21, wherein a second portion of the connection electrode extends away from the contact area in a direction toward the active area.

23. The display device of claim 22, wherein a first length of the first portion of the connection electrode is greater than a second length of the second portion of the connection electrode.

24. The display device of claim 22, wherein a first length of the first portion of the connection electrode is equal to a second length of the second portion of the connection electrode.

25. The display device of claim 19, wherein the plurality of first holes are arranged in a grid.

26. The display device of claim 19, wherein the plurality of first holes and the plurality of second holes have a same shape and a same size.

27. The display device of claim 19, wherein a center of at least one of plurality of first holes is aligned with a center of at least one of plurality of second holes.

28. The display device of claim 19, wherein the connection electrode is electrically connected to a low potential power line.

29. The display device of claim 1, wherein the hole included in the at least one of the plurality of touch routing lines is an aperture completely enclosed by a conductive material of the at least one of the plurality of touch routing lines.

30. The display device of claim 1, wherein the at least one of the plurality of touch routing lines includes a continuous conductive body having an outer perimeter, and wherein the hole is an opening defined entirely within the outer perimeter of the continuous conductive body.

31. The display device of claim 1, wherein the at least one of the plurality of touch routing lines includes an inner edge defining an inner boundary, and wherein the inner boundary defines the hole through the at least one of the plurality of touch routing lines.

* * * * *